United States Patent
Xiong et al.

(10) Patent No.: US 9,627,447 B2
(45) Date of Patent: Apr. 18, 2017

(54) ACTIVE MATRIX ORGANIC LIGHT EMITTING DIODE PANEL AND METHOD FOR MANUFACTURING THE SAME

(71) Applicant: Shanghai Tianma Micro-Electronics Co., Ltd., Shanghai (CN)

(72) Inventors: Zhiyong Xiong, Shanghai (CN); Bengang Zhao, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 14/086,613

(22) Filed: Nov. 21, 2013

(65) Prior Publication Data

US 2014/0159004 A1 Jun. 12, 2014

(30) Foreign Application Priority Data

Dec. 7, 2012 (CN) .......................... 2012 1 0526005

(51) Int. Cl.
*H01L 29/08* (2006.01)
*H01L 35/24* (2006.01)
*H01L 51/00* (2006.01)
*H01L 27/32* (2006.01)

(52) U.S. Cl.
CPC ...... *H01L 27/3211* (2013.01); *H01L 27/3216* (2013.01); *H01L 27/3258* (2013.01)

(58) Field of Classification Search
CPC .................................................. H01L 27/3211
USPC ................... 257/40; 313/504, 505, 506, 586
See application file for complete search history.

(56) References Cited

U.S. PATENT DOCUMENTS

| 6,107,734 | A  | * | 8/2000  | Tanaka et al. ................ 313/506 |
| 7,030,554 | B2 | * | 4/2006  | Liao et al. ..................... 313/504 |
| 7,825,584 | B2 | * | 11/2010 | Kim .................... H01L 27/3216 313/498 |
| 8,026,531 | B2 | * | 9/2011  | Seo et al. ......................... 257/99 |
| 8,680,562 | B2 | * | 3/2014  | Seo et al. ......................... 257/99 |
| 8,890,204 | B2 | * | 11/2014 | Seo et al. ......................... 257/99 |

(Continued)

FOREIGN PATENT DOCUMENTS

| CN | 101051648 A | 10/2007 |
| CN | 102405686 A | 4/2012 |
| CN | 102714214 A | 10/2012 |

OTHER PUBLICATIONS

Office Action as issued in corresponding Chinese Application No. 201210526005.9, dated Mar. 19, 2015.

(Continued)

*Primary Examiner* — Telly Green
(74) *Attorney, Agent, or Firm* — Alston & Bird LLP

(57) ABSTRACT

The invention discloses an active matrix organic light emitting diode panel and a method for manufacturing the same. The active matrix organic light emitting diode panel includes a substrate, an organic film formed on the substrate, and a plurality of red, green and blue organic light emitting diodes formed on the organic film. A recess or protrusion is formed in the organic film in a region corresponding to the blue organic light emitting diode. The blue organic light emitting diode is formed on the recess or protrusion, and the surface area of the recess or protrusion is larger than the area of the surface where the red or green organic light emitting diodes contacts the organic film.

17 Claims, 7 Drawing Sheets

(56) References Cited

U.S. PATENT DOCUMENTS

| | | |
|---|---|---|
| 2003/0052597 A1 | 3/2003 | Sakurai |
| 2004/0217694 A1 | 11/2004 | Cok et al. |
| 2005/0173700 A1* | 8/2005 | Liao et al. .................. 257/40 |
| 2008/0001525 A1 | 1/2008 | Chao et al. |
| 2008/0211385 A1 | 9/2008 | Kim et al. |
| 2011/0127506 A1 | 6/2011 | So |
| 2012/0091439 A1 | 4/2012 | Nishiyama et al. |

OTHER PUBLICATIONS

European Search Report for application EP13193031 dated Sep. 26, 2016.

* cited by examiner

ACTIVE MATRIX ORGANIC LIGHT EMITTING DIODE PANEL AND METHOD FOR MANUFACTURING THE SAME

CROSS REFERENCE TO RELATED APPLICATION

This application claims the benefit of priority to Chinese Patent Application No. 201210526005.9, entitled "ACTIVE MATRIX ORGANIC LIGHT EMITTING DIODE PANEL AND METHOD FOR MANUFACTURING THE SAME", filed with the Chinese Patent Office on Dec. 7, 2012, the contents of which is incorporated herein by reference in its entirety.

FIELD OF THE INVENTION

The present invention relates to the flat panel display technology, and in particular, to an active matrix organic light emitting diode panel and a method for manufacturing the same.

BACKGROUND OF THE INVENTION

An active matrix organic light emitting diode (AMOLED) panel is far superior to a thin-film technology liquid crystal display (TFT LCD) in picture quality, efficiency and cost. As for the display efficiency, the response speed of the AMOLED is faster, the contrast of the AMOLED is higher and the viewing angle of the AMOLED is broader. In addition, the AMOLED has a feature of self-luminous, whereby no backlight source is needed and the AMOLED can be lighter, thinner and more energy efficient than the TFT. Therefore, the AMOLED is referred to as the next generation of display technology.

Generally, as shown in FIG. 1, an AMOLED panel 100 includes: a substrate 101 and a plurality of pixels 102 formed on the substrate 101. The pixel 102 includes a red organic light emitting diode 1021, a green organic light emitting diode 1022 and a blue organic light emitting diode 1023. In general, the areas of the red organic light emitting diode 1021, the green organic light emitting diode 1022 and the blue organic light emitting diode 1023 are equal. However, the lifetime of the blue organic light emitting diode is typically shorter, as shown in FIG. 2, because the lifetime of the blue organic light emitting diode has stronger dependency with the current density thereof. The greater the current density is, the shorter the lifetime of the blue organic light emitting diode is, while the smaller the current density is, the longer the lifetime of the blue organic light emitting diode is. In order to prolong the lifetime of the blue organic light emitting diode, the blue organic light emitting diode 1023 of large area is typically manufactured and the current density thereof is reduced to prolong the lifetime of the blue organic light emitting diode such that the service life of the whole AMOLED is prolonged.

However, as shown in FIG. 3, in the case where the area of the blue organic light emitting diode is increased, the area of the whole pixel tube 102 is also increased, causing the resolution of the whole AMOLED panel to be reduced. That is, the prolonging of the service life of the AMOLED is at the expense of compromising the resolution of the AMOLED panel.

BRIEF SUMMARY OF THE INVENTION

An active matrix organic light emitting diode panel and a method for manufacturing the same are provided in the present invention, for the purpose of increasing the area of a blue organic light emitting diode without changing the resolution, so as to improve the service life of the whole AMOLED.

To solve the above mentioned technical problem, the present invention provides an active matrix organic light emitting diode panel, including: a substrate; an organic film formed on the substrate; and a plurality of red, green and blue organic light emitting diodes formed on the organic film; wherein a recess or protrusion is formed in the organic film in a region corresponding to the blue organic light emitting diode, the blue organic light emitting diode is formed on the recess or protrusion, and the surface area of the recess or protrusion is larger than the area of the surface where the red organic light emitting diode or the green organic light emitting diode contacts the organic film.

Optionally, the area of the surface where the red organic light emitting diode contacts the organic film is equal to the area of the surface where the green organic light emitting diode contacts the organic film.

Optionally, the opening area of the recess is less than or equal to the area of the surface where the red or green organic light emitting diode contacts the organic film.

Optionally, the bottom surface area of the protrusion is less than or equal to the area of the surface where the red or green organic light emitting diode contacts the organic film.

Optionally, the recess is wedge-shaped, W-shaped or hemispherical.

Optionally, the protrusion is wedge-shaped, M-shaped or hemispherical.

Optionally, the depth of the recess is less than or equal to the thickness of the organic film.

Correspondingly, the invention further provides a method for manufacturing an active matrix organic light emitting diode panel, including: providing a substrate; forming an organic film on the substrate; exposing the organic film with a gray-tone mask; etching to remove part of the organic film and forming multiple recesses or protrusions on the organic film; and forming a plurality of red, green and blue organic light emitting diodes on the organic film; wherein the blue organic light emitting diode is formed on the recess or protrusion, and the surface area of the recess or the protrusion is larger than or equal to the area of the surface where the red or green organic light emitting diode contacts the organic film.

Optionally, the area of the surface where the red organic light emitting diode contacts the organic film is equal to the area of the surface where the green organic light emitting diode contacts the organic film.

Optionally, the opening area of the recess is less than or equal to the area of the surface where the red or green organic light emitting diode contacts the organic film.

Optionally, the bottom surface area of the protrusion is less than or equal to the area of the surface where the red or green organic light emitting diode contacts the organic film.

Optionally, the recess is wedge-shaped, W-shaped or hemispherical.

Optionally, the protrusion is wedge-shaped, M-shaped or hemispherical.

Optionally, the depth of the recess is less than or equal to the thickness of the organic film.

Optionally, before forming the organic film on the substrate, the method further includes: forming a plurality of thin-film transistors on the substrate; and forming a passivation layer on the thin-film transistor.

In the active matrix organic light emitting diode panel provided in the present invention, the recess or protrusion is formed in the organic film in the region corresponding to the blue organic light emitting diode, and the blue organic light emitting diode is formed on the recess or protrusion for which the surface area is larger than or equal to the area of the surface where the red or green organic light emitting diode contacts the organic film. The blue organic light emitting diode is formed on the recess or protrusion, that is, the area of the blue organic light emitting diode depends on the surface area of the recess or protrusion. Therefore, in the case where the surface area of the recess or protrusion is larger than the area of the surface where the red or green organic light emitting diode contacts the organic film, the area of the blue organic light emitting diode is relatively increased and the current density of the blue organic light emitting diode may be reduced accordingly, so that the lifetime of the blue organic light emitting diode is prolonged. Since the increase in the area of the blue organic light emitting diode may be implemented simply by increasing the surface area of the recess or protrusion without increasing the opening area of the recess or the bottom surface area of the protrusion, the size of the pixel can be maintained as it is, that is, the area of the blue organic light emitting diode is increased without changing the resolution, and the service life of the whole AMOLED is improved.

DETAILED DESCRIPTION OF THE INVENTION

The essence of the present invention is to form a blue organic light emitting diode on a recess or protrusion and to change the area of the blue organic light emitting diode by changing the surface area of the recess or protrusion. In the case where the surface area of the recess or protrusion is larger than the area of the surface where the red or green organic light emitting diode contacts the organic film, the area of the blue organic light emitting diode is relatively increased and the current density therein may be reduced accordingly, thus the lifetime of the blue organic light emitting diode and hence the service life of the whole AMOLED are prolonged without compromising the resolution of the whole AMOLED.

To make the object, technical solution and advantages of the present invention clearer, in the following, detailed description is made in conjunction with the drawings.

In the following, a method for manufacturing an active matrix organic light emitting diode panel according to an embodiment of the present invention will be described in detail in conjunction with FIG. 4 to FIG. 12.

Figure 4:
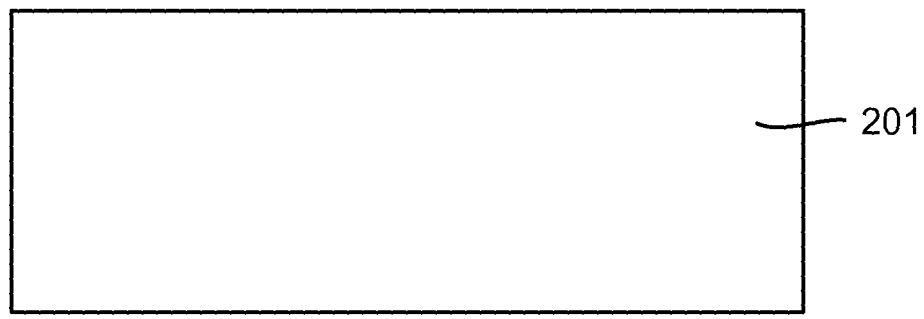
FIG. 4 to FIG. 11 are sectional views of an active matrix organic light emitting diode panel in the manufacturing process according to an embodiment of the present invention.

Firstly, as shown in FIG. 4, a substrate 201 is provided. The substrate 201 typically is a transparent glass substrate.

Figure 5:
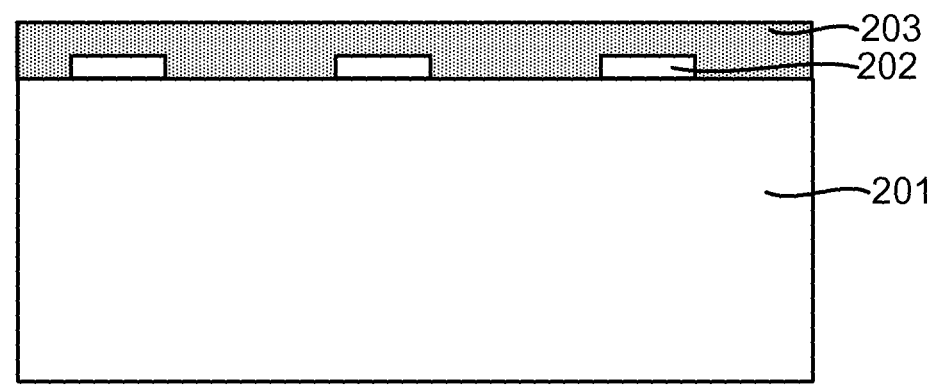

Next, as shown in FIG. 5, a plurality of thin film transistors 202 are formed on the substrate 201, and a passivation layer 203 is formed on the thin film transistors 202 and the substrate 201.

Figure 6:
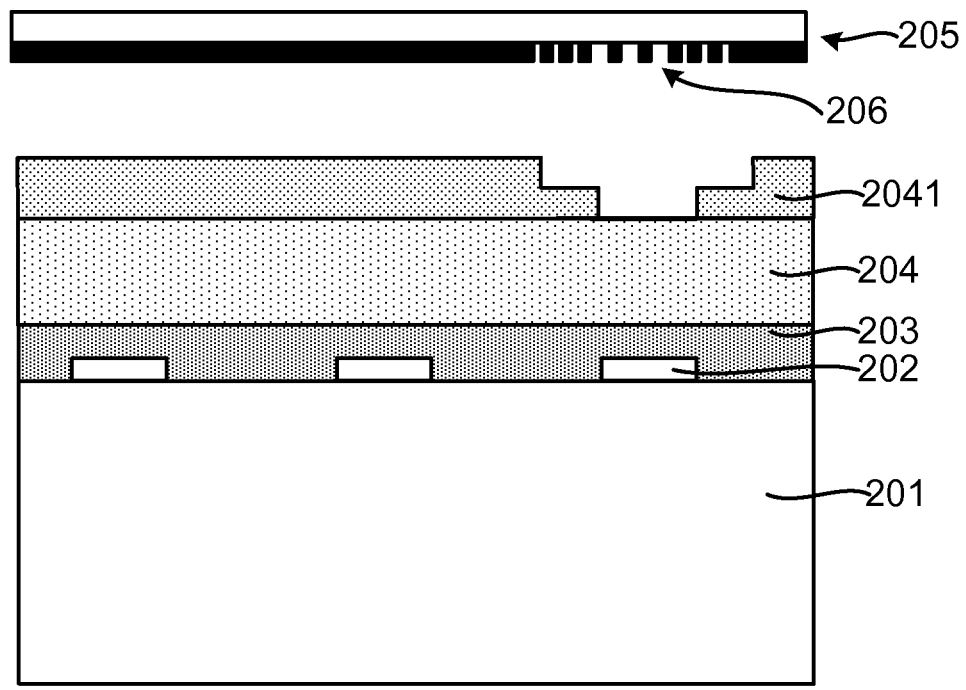

Next, as shown in FIG. 6, an organic film 204 is formed on the passivation layer 203. The material of the shrinking organic film is polyimide. Then, photoresist 2041 is coated on the organic film 204 and the photoresist 2041 is exposed with a gray-tone mask 205. On the gray-tone mask 205, slits 206 with different widths less than the size of pixel are arranged. Therefore, after the photoresist 2041 is exposed with the gray-tone mask 205, exposed parts with different exposure levels may be formed on the photoresist 2041, that is, different levels of exposure are formed on the photoresist 2041 and a part of the organic film is revealed.

Figure 7:
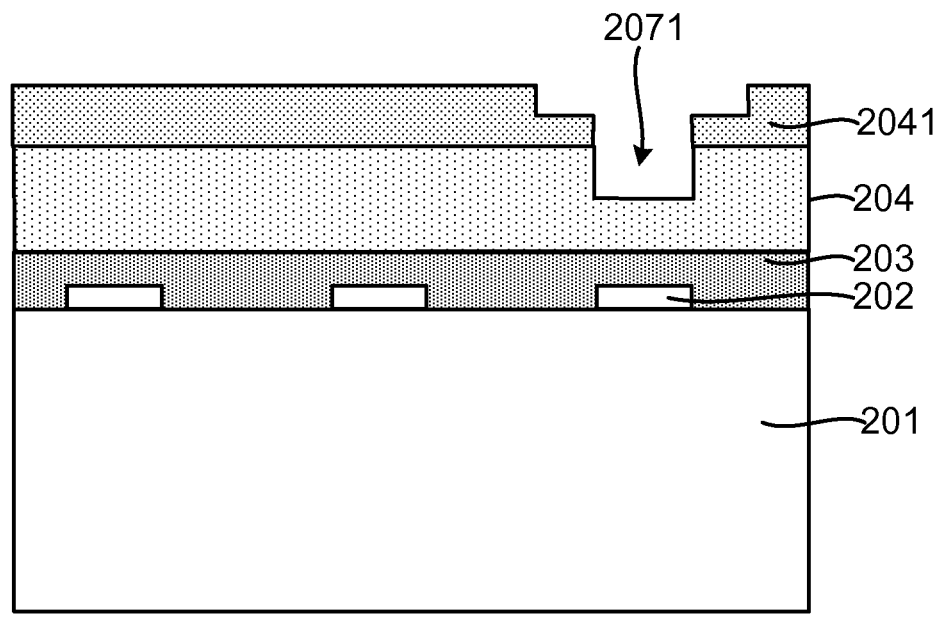

Next, as shown in FIG. 7, a first dry etching is performed on the organic film 204, so as to form a first etched recess 2071 on the organic film 204.

Figure 8:
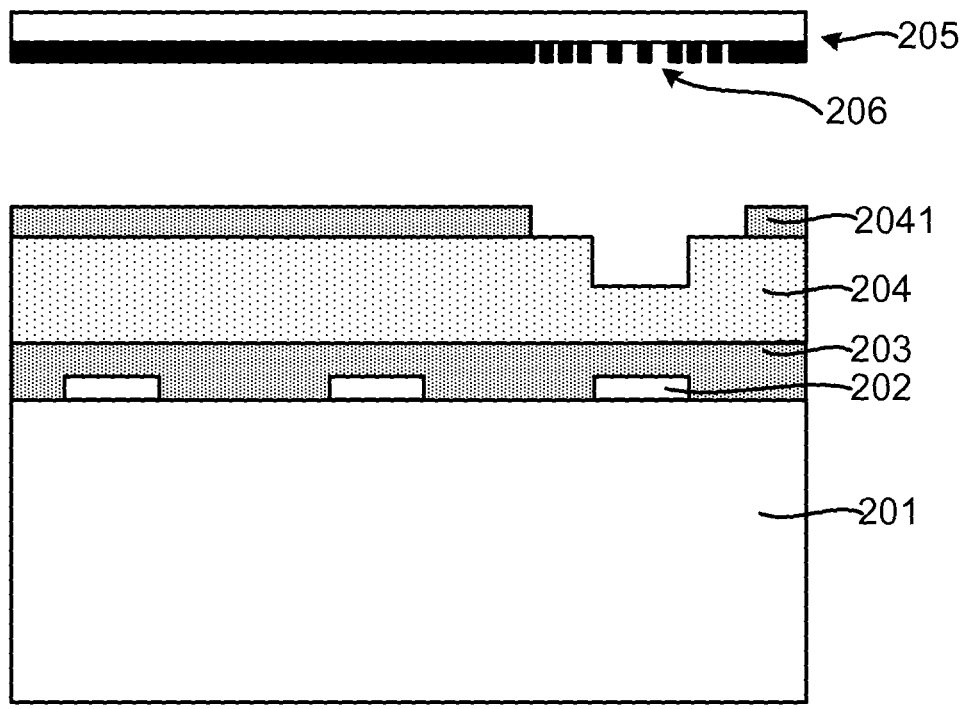

Next, as shown in FIG. 8, a second exposing is performed on the photoresist 2041 with the same gray-tone mask 205, and another part of the organic film 204 may be further revealed due to different exposure levels.

Figure 9:
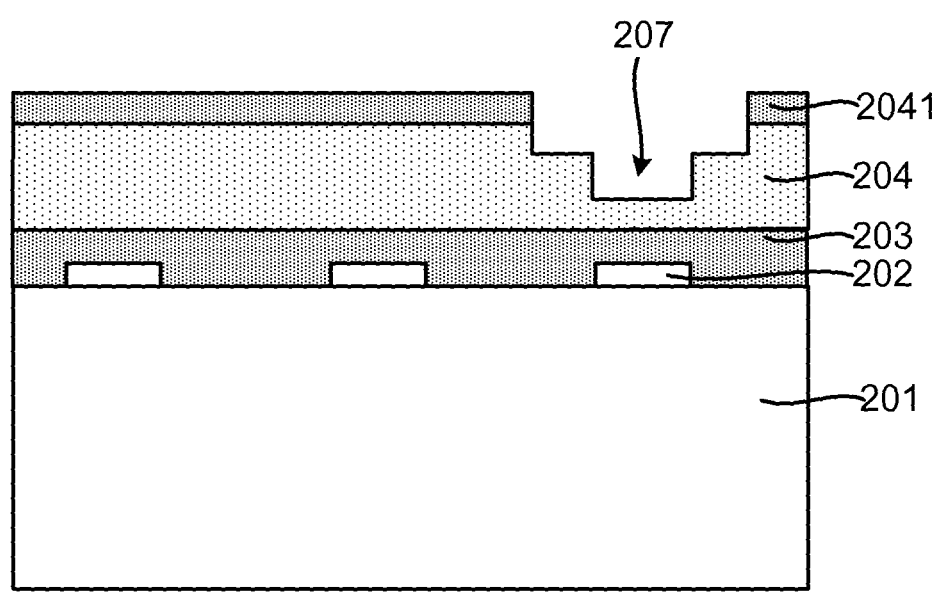

Next, as shown in FIG. 9, a second dry etching is further performed on the organic film 204 in addition to the first etched recess 2071. Accordingly, multiple recesses 207 with different depths are formed in the organic film 204.

Figure 10:
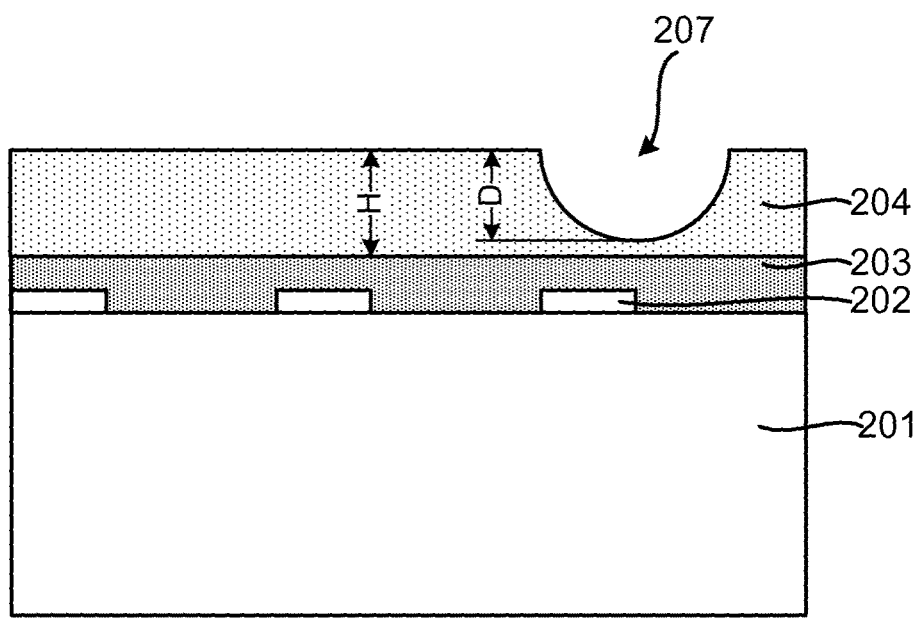

Next, as shown in FIG. 10, the residual of the photoresist 2041 is stripped off. Then the organic film 204 undergoes high-temperature baking under the temperature in a range of 180 to 220 degrees Celsius for a period of 10 minutes to 15 minutes. In the baked organic film 204, steps of the recess 207 may shrink under heat, therefore a smooth hemispherical or semi-ellipsoidal shape is formed. And since the recess 207 is formed in the organic film 204, the maximum depth D of the recess 207 should be less than or equal to the thickness H of the organic film 204.

Figure 11:
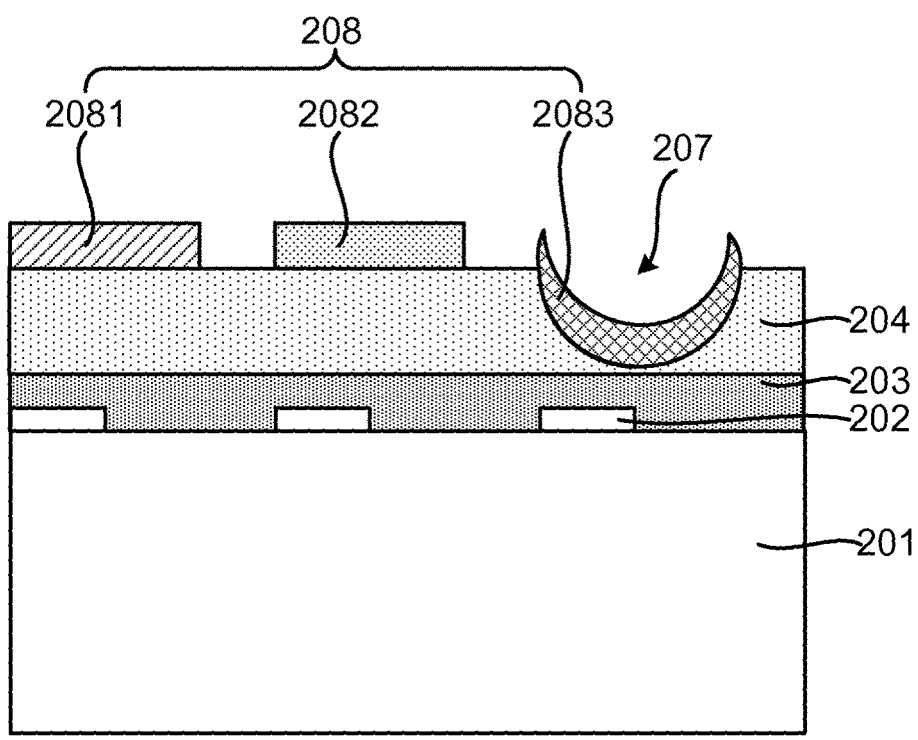

Next, as shown in FIG. 11, a plurality of pixels 208 are formed on the organic film 204. Each of the plurality of pixels 208 includes a red organic light emitting diode 2081, a green organic light emitting diode 2082 and a blue organic light emitting diode 2083. The blue organic light emitting diode 2083 is formed on the recess 207, and the surface area of the recess 207 is larger than or equal to the area of the surface where the red organic light emitting diode 2081 or the green organic light emitting diode 2082 contacts the organic film 204.

Each of the colored organic light emitting diodes, i.e. the red organic light emitting diode 2081, the green organic light emitting diode 2082 and the blue organic light emitting diode 2083 which are included in each pixel 208, includes a transparent anode layer formed on the organic film, a hole injection layer formed on the transparent anode layer, a hole transport layer formed on the hole injection layer, an organic light emitting layer formed on the hole transport layer, an electron transport layer formed on the organic light emitting layer, an electron injection layer formed on the electron transport layer and a cathode formed on the electron injection layer. The construction and the manufacture of the colored organic light emitting diodes are well known and will not be described herein.

So far, an active matrix organic light emitting diode (AMOLED) panel 200 as shown in FIG. 11 is formed, including the substrate 201, the organic film 204 formed on the substrate 201, and the plurality of pixels 208 formed on the organic film 204. Each of the pixels 208 includes the red organic light emitting diode 2081, the green organic light emitting diode 2082 and the blue organic light emitting diode 2083. A recess 207 is formed in the organic film 204 in the region corresponding to the blue organic light emitting diode 2083, the blue organic light emitting diode 2083 is formed on the recess 207, and the surface area of the recess 207 is larger than the area of the surface where the red organic light emitting diode 2081 or the green organic light emitting diode 2082 contacts the organic film 204. Generally, the area of the surface where the red organic light emitting diode 2081 contacts the organic film 204 is equal to the area of the surface where the green organic light emitting diode 2082 contacts the organic film 204.

Figure 1:
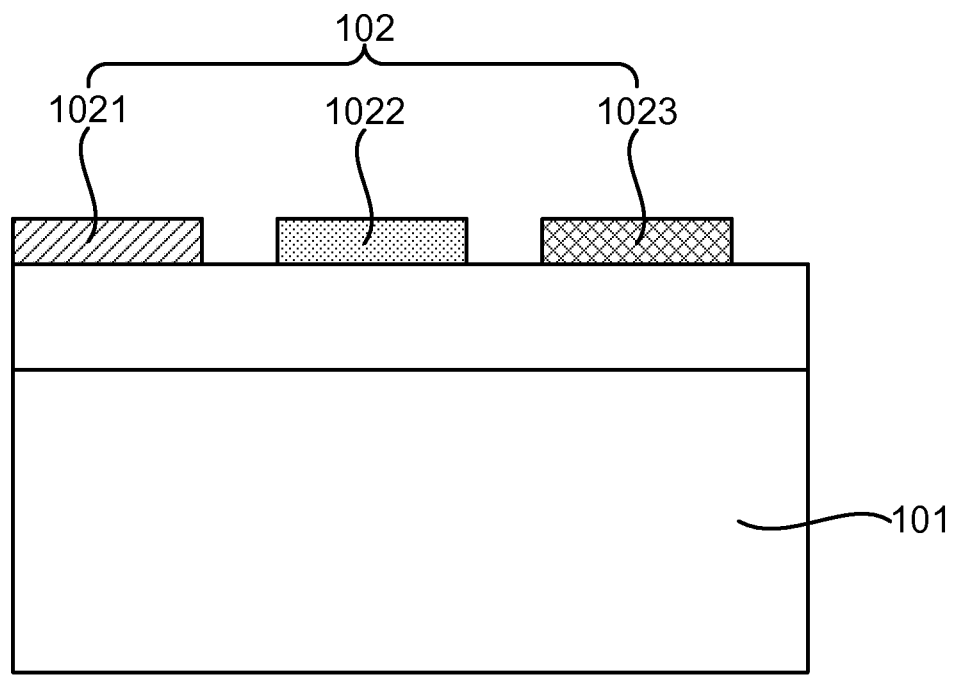
FIG. 1 is a schematic structural diagram of an active matrix organic light emitting diode panel in the prior art.
Figure 2:
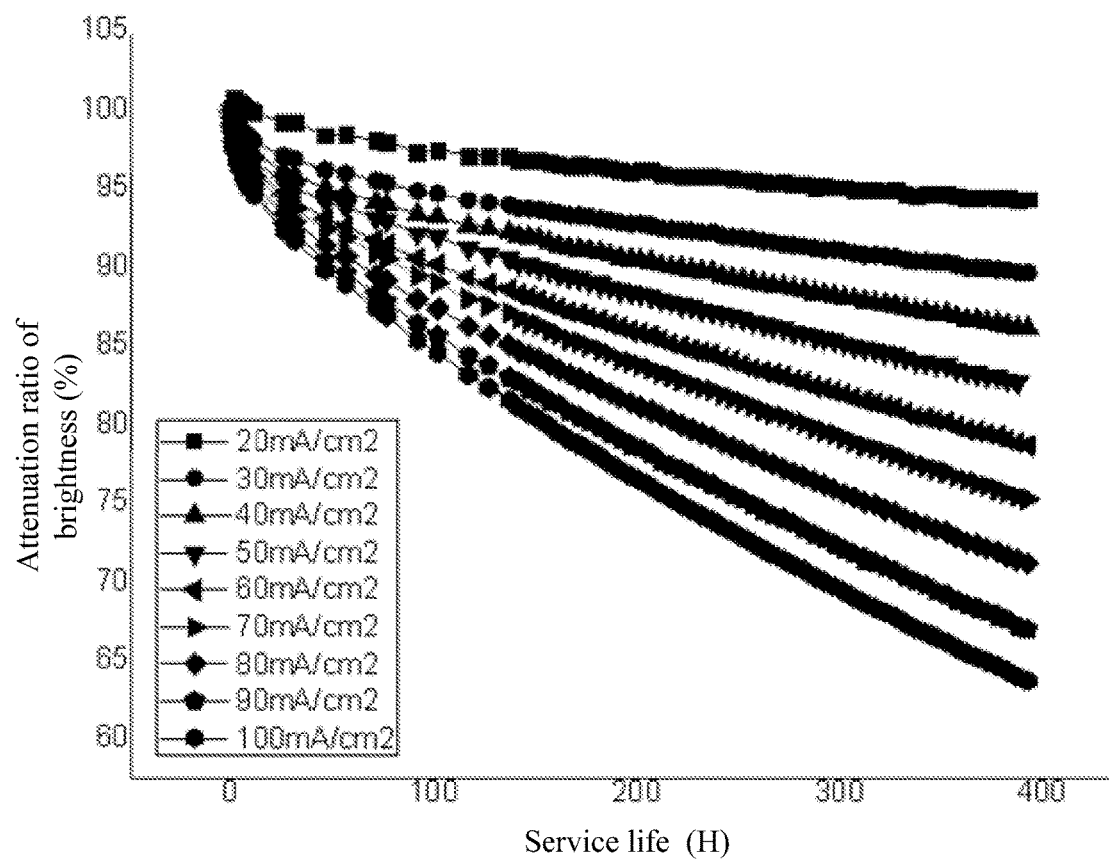
FIG. 2 is a diagram of the relation between the lifetime and the surface current density of the blue organic light emitting diode.
Figure 3:
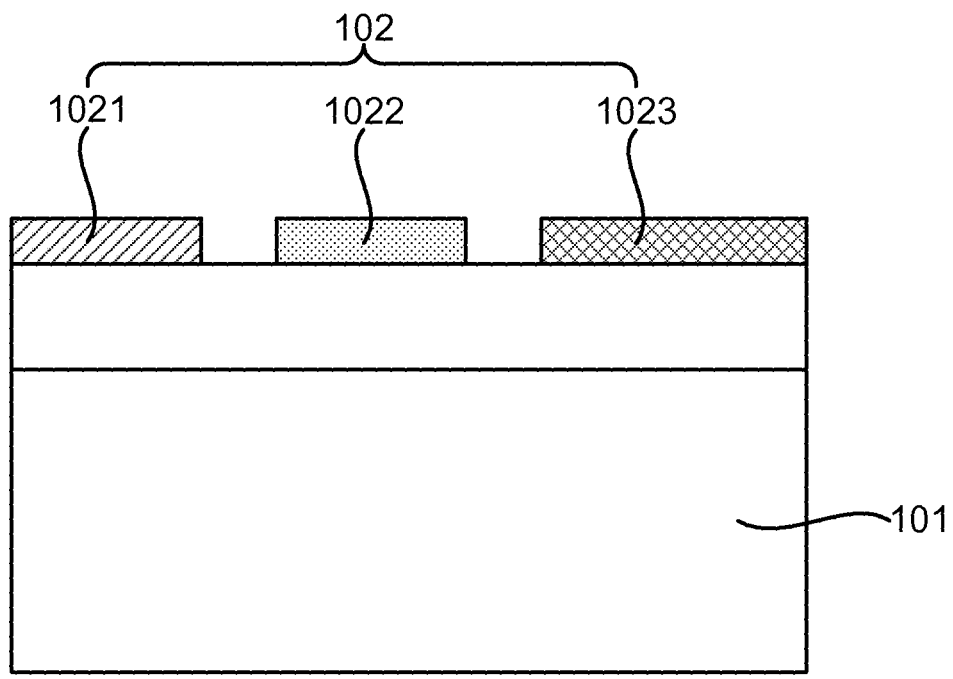
FIG. 3 is a schematic structural diagram of another active matrix organic light emitting diode panel in the prior art.

The blue organic light emitting diode 2083 is formed on the recess 207. According to the relation between the lifetime and the current density of the blue organic light emitting diode as shown in FIG. 2, it can be seen that the lifetime of the blue organic light emitting diode 2083 depends on the current density on the surface. That is to say, the lifetime of the blue organic light emitting diode 2083 depends on the surface area of the recess 207. The larger the surface area of the recess 207 is, the smaller the density of the current flowing through the blue organic light emitting diode 2083 is, and the longer the lifetime of the blue organic light emitting diode 2083 is. Therefore, it is just needed to increase the surface area of the recess 207 to prolong the lifetime of the blue organic light emitting diode 2083. In the case where the surface area of the recess 207 is larger than the area of the surface where the red organic light emitting diode 2081 or the green organic light emitting diode 2082 contacts the organic film 204, the lifetime of the blue organic light emitting diode 2083 may be prolonged as compared with the prior art.

It should be noted that the above arrangement of the organic light emitting diodes is only exemplary, and there may be various arrangements for the red organic light emitting diode 2081, the green organic light emitting diode 2082 and the blue organic light emitting diode 2083 to form a pixel, with the only condition that the area of the surface where the blue organic light emitting diode 2083 contacts the organic film is larger than the area of the surface where the red organic light emitting diode 2081 or the green organic light emitting diode 2082 contacts the organic film.

Figure 12:
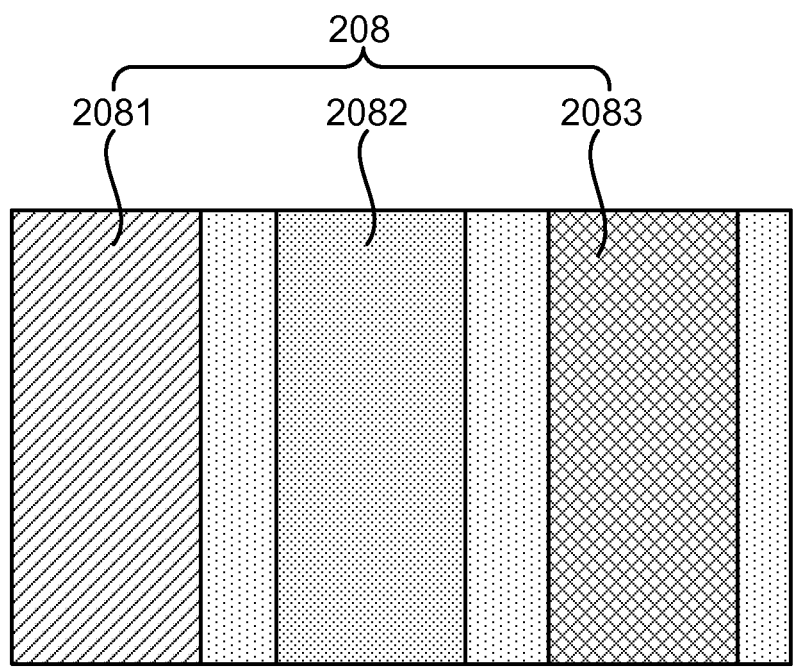
FIG. 12 is a top view of an active matrix organic light emitting diode panel according to an embodiment of the present invention.

As shown in FIG. 12, the opening area of the recess 207 may be less than or equal to the area of the surface where the red organic light emitting diode 2081 or the green organic light emitting diode 2082 contacts the organic film 204, to further improve the resolution of the active matrix organic light emitting diode panel 200. The resolution of the active matrix organic light emitting diode panel 200 depends on the size of the cross sectional of the pixel 208. The area of the surface where the red organic light emitting diode 2081 or the green organic light emitting diode 2082 contacts the organic film 204 is unchanged, while the opening area of the recess 207 is less than or equal to the area of the surface where the red organic light emitting diode 2081 or the green organic light emitting diode 2082 contacts the organic film 204. That is, the area of the surface where the blue organic light emitting diode 2083 contacts the organic film is less than or equal to the area of the surface where the red organic light emitting diode 2081 or the green organic light emitting diode 2082 contacts the organic film. Therefore, the size of the whole pixel 208 is reduced relatively, and the resolution of the whole active matrix organic light emitting diode panel 200 is improved.

Still referring to FIG. 10, the recess 207 in the embodiment is hemispherical. Of course, the shape of the recess 207 is not limited to be hemispherical and may be arbitrary shape with an opening area less than or equal to the area of the surface where the red organic light emitting diode 2081 or the green organic light emitting diode 2082 contacts the organic film 204, such as W-shaped, step-shaped or wedge-shaped. Recess of different shapes may be formed by employing different gray-tone masks 205. In the case where the boundary of the recess 207 is sharp, for example, for the W-shaped, step-shaped or wedge-shaped recess, the high-temperature baking may not be performed to maintain the sharp boundary of the recess 207.

In the present invention, the surface area of the blue organic light emitting diode is larger than the surface area of the red or green organic light emitting diode, thereby the service life of the blue organic light emitting diode is prolonged. For this purpose, the blue organic light emitting diode is formed on the recess for which the surface area is larger than the area of the surface where the red or green organic light emitting diode contacts the organic film in this embodiment. It should be understood that, in another embodiment of the present invention, the recess may be replaced with a protrusion. As long as the surface area of the protrusion is larger than the area of the surface where the red or green organic light emitting diode contacts the organic film and the blue organic light emitting diode is formed on the protrusion, the lifetime of the blue organic light emitting diode can also be prolonged. Similarly, the protrusion may be hemispherical, M-shaped or wedge-shaped. In addition, the bottom surface area of the protrusion may be less than or equal to the area of the surface where the red or green organic light emitting diode contacts the organic film to further improve the resolution of the active matrix organic light emitting diode panel.

It should be noted that a recess or protrusion may also be formed in the organic film at the place corresponding to the red organic light emitting diode 2081 and/or the green organic light emitting diode 2082, under the condition that the area of the surface where the blue organic light emitting diode 2083 contacts the organic film is larger than the area of the surface where the red organic light emitting diode 2081 or the green organic light emitting diode 2082 contacts the organic film.

In summary, in the active matrix organic light emitting diode panel provided in the present invention, the recess or protrusion is formed in the organic film in the region corresponding to the blue organic light emitting diode, the blue organic light emitting diode is formed on the recess or protrusion, and the surface area of the recess or protrusion is larger than or equal to the area of the surface where the red or green organic light emitting diode contacts the organic film. Therefore, as compared with the prior art, the area of the blue organic light emitting diode is increased and the lifetime of the blue organic light emitting diode is prolonged. Since the increasing in the area of the blue organic light emitting diode may be implemented simply by increasing the surface area of the recess or protrusion without increasing the opening area of the recess or the bottom surface area of the protrusion, the size of the pixel can be maintained as it is, that is, the area of the blue organic light emitting diode is increased without changing the resolution, so that the service life of the whole AMOLED is improved.

It is obvious that various changes and modifications may be made to the present invention by those skilled in the art without departing from the spirit and the scope of the present invention. Therefore, the changes and modifications within the scope of claims of the present invention and its equivalents are included in the present invention.

What is claimed is:

1. An active matrix organic light emitting diode panel, comprising:
   a substrate;
   a patterned layer comprising thin film transistors (TFTs) on the substrate, divided into red, green, and blue regions;
   a passivation layer disposed on the patterned layer;
   an organic film formed on the passivation layer;
   a recess or protrusion formed in the organic film aligned only to the blue region;
   a blue organic light emitting diode formed in the recess or on the protrusion in the organic film aligned only to the blue region; and
   a red and a green organic light emitting diodes formed on the top surface of the organic film aligned to the red and green regions respectively, wherein the organic film surface over the red and green regions have no recess or protrusion, and wherein the contact area of the blue organic light emitting diode with the organic film is larger than the contact area of the red or green organic light emitting diode with the organic film.

2. The active matrix organic light emitting diode panel according to claim 1, wherein the contact area of red organic light emitting diode with the organic film is equal to the contact area of the green organic light emitting diode with the organic film.

3. The active matrix organic light emitting diode panel according to claim 1, wherein an opening area of the recess is less than or equal to the contact area of the red organic light emitting diode or the green organic light emitting diode with the organic film.

4. The active matrix organic light emitting diode panel according to claim 2, wherein an opening area of the recess is less than or equal to the contact area of the red organic light emitting diode or the green organic light emitting diode with the organic film.

5. The active matrix organic light emitting diode panel according to claim 1, wherein a bottom surface area of the protrusion is less than or equal to the contact area of the red organic light emitting diode or the green organic light emitting diode with the organic film.

6. The active matrix organic light emitting diode panel according to claim 2, wherein a bottom surface area of the protrusion is less than or equal to the contact area of the red organic light emitting diode or the green organic light emitting diode with the organic film.

7. The active matrix organic light emitting diode panel according to claim 1, wherein the recess is wedge-shaped, W-shaped or hemispherical.

8. The active matrix organic light emitting diode panel according to claim 1, wherein the protrusion is wedge-shaped, M-shaped or hemispherical.

9. The active matrix organic light emitting diode panel according to claim 3, wherein a depth of the recess is less than or equal to a thickness of the organic film.

10. A method for manufacturing an active matrix organic light emitting diode panel, comprising:
    providing a substrate;
    providing a patterned layer comprising thin film transistors (TFTs) on the substrate, divided into red, green, and blue regions;
    providing a passivation layer disposed on the patterned layer;
    forming an organic film on the passivation layer;
    forming a recess or protrusion in the organic film aligned only to the blue region;
    forming a blue organic light emitting diode in the recess or on the protrusion in the organic film aligned only to the blue region; and
    forming a red and a green organic light emitting diodes on the top surface of the organic film aligned to the red and green regions respectively, wherein the organic film surface over the red and green regions have no recess or protrusion, and wherein the contact area of the blue organic light emitting diode with the organic film is larger than the contact area of the red or green organic light emitting diode with the organic film.

11. The method for manufacturing the active matrix organic light emitting diode panel according to claim 10, wherein the contact area of the red organic light emitting diode with the organic film is equal to the contact area of the green organic light emitting diode with the organic film.

12. The method for manufacturing the active matrix organic light emitting diode panel according to claim 10, wherein an opening area of the recess is less than or equal to the contact area of the red organic light emitting diode or the green organic light emitting diode with the organic film.

13. The method for manufacturing the active matrix organic light emitting diode panel according to claim 11, wherein an opening area of the recess is less than or equal to the contact area of the red organic light emitting diode or the green organic light emitting diode with the organic film.

14. The method for manufacturing the active matrix organic light emitting diode panel according to claim 10, wherein a bottom surface area of the protrusion is less than or equal to the contact area of the red organic light emitting diode or the green organic light emitting diode with the organic film.

15. The method for manufacturing the active matrix organic light emitting diode panel according to claim 11, wherein a bottom surface area of the protrusion is less than or equal to the contact area of the red organic light emitting diode or the green organic light emitting diode with the organic film.

16. The method for manufacturing the active matrix organic light emitting diode panel according to claim 10, wherein a depth of the recess is less than or equal to a thickness of the organic film.

17. The method for manufacturing the active matrix organic light emitting diode panel according to claim 10, wherein, before forming the organic film on the substrate, the method further comprises:
    forming a plurality of thin-film transistors on the substrate; and
    forming a passivation layer on the thin-film transistor.

* * * * *